(12) United States Patent
Mills

(10) Patent No.: US 10,698,008 B2
(45) Date of Patent: Jun. 30, 2020

(54) CURRENT-SENSE RATIO CALIBRATION

(71) Applicant: TEXAS INSTRUMENTS INCORPORATED, Dallas, TX (US)

(72) Inventor: Michael James Mills, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 181 days.

(21) Appl. No.: 15/815,218

(22) Filed: Nov. 16, 2017

(65) Prior Publication Data
US 2019/0146013 A1  May 16, 2019

(51) Int. Cl.
*G01R 35/00* (2006.01)
*G05F 1/46* (2006.01)
*G01R 19/10* (2006.01)
*G01R 19/252* (2006.01)
*G01R 19/165* (2006.01)
*G01R 19/14* (2006.01)

(52) U.S. Cl.
CPC ............ *G01R 19/10* (2013.01); *G01R 19/14* (2013.01); *G01R 19/16519* (2013.01); *G01R 19/252* (2013.01)

(58) Field of Classification Search
CPC .... G01R 19/0092; G01R 19/10; G01R 19/14; G01R 19/165; G01R 19/16519; G01R 19/252; G01R 35/005; G05F 1/46
See application file for complete search history.

(56) References Cited

U.S. PATENT DOCUMENTS

2016/0069939 A1\* 3/2016 Zhang ................. G01R 19/252
324/76.39
2019/0036521 A1\* 1/2019 Wu ..................... H03K 17/0822

\* cited by examiner

*Primary Examiner* — Neel D Shah
(74) *Attorney, Agent, or Firm* — Michael A. Davis, Jr.; Charles A. Brill; Frank D. Cimino

(57) ABSTRACT

A current-sense ratio calibration system includes a power field effect transistor (FET) integrated circuit (IC) that includes a regulator FET to regulate current through a power path and a sense FET to provide a sense current to a sense path. The regulator FET and sense FET have an intended current-sense ratio. The system calibrates the current-sense ratio by applying proportioned stimulus signals to the power and sense paths, the proportion being the intended current-sense ratio. The calibration circuitry compares a measurement of a sense path circuit parameter made during the stimulus application to a measurement of the parameter made not during the stimulus application to derive an error term used to calibrate for any sources of error in the current-sense ratio.

20 Claims, 2 Drawing Sheets

CURRENT-SENSE RATIO CALIBRATION

TECHNICAL FIELD

This disclosure relates to electronic circuits and particular to current-sense ratio calibration.

BACKGROUND

A USB power supply as used, for example, in a portable computer system may include a low-impedance power path to provide power from a source of electrical power such as a battery to a connected device on a bus voltage line (VBUS). Such a power supply may provide circuitry to regulate the current on the power path, by switching it on and off, limiting its magnitude, and/or changing its direction. Field effect transistors (FETs), e.g., metal-oxide-semiconductor FETs (MOSFETs), can be used in such circuitry to perform the regulation. NexFETs are cost-effective FETs that can provide very low resistance for power regulation applications, but are manufactured by a different process than transistors used for other circuitry, and therefore are generally provided on a different integrated circuit (IC) than other circuitry. While NextFET ICs and ICs made by other processes can often be co-packaged in a single module, such combination is not always possible or desired.

SUMMARY

In an example, current-sense ratio calibration system includes a power field effect transistor (FET) integrated circuit (IC) that includes a regulator FET to regulate current through a power path. The power FET IC also includes a sense FET to provide a sense current to a sense path. The regulator FET and sense FET have an intended current-sense ratio. The system further includes a controller IC comprising calibration circuitry to calibrate the current-sense ratio, the calibration circuitry being configured to apply stimuli to the power and sense paths. The stimuli to the respective paths is proportioned by the intended current-sense ratio. The calibration circuitry compares a measurement of a sense path circuit parameter made during the stimulus application to a measurement of the parameter made not during the stimulus application, so as to calibrate for any sources of error in the current-sense ratio.

In another example, a current-sense ratio calibration method includes applying proportioned stimuli to a power path that includes a regulator transistor and to a sense path that includes a matched sense transistor. The regulator transistor and sense transistor have an intended current-sense ratio. A measurement of a sense path circuit parameter made during the stimulus application is compared to a measurement of the parameter made not during the stimulus application to derive an error term that is used to calibrate a perceived current-sense ratio to the intended current-sense ratio.

In yet another example, a current-sense ratio calibration circuit includes two stimulus sources, one being a power path stimulus source to apply a stimulus in a power path having a power FET for regulating current through the power path, and the other being a sense path stimulus source to apply, simultaneous to the application of the stimulus in the power path, a stimulus in a sense path having a sense FET that is matched to the power FET but smaller than the power FET such that the power FET and the sense FET have an intended current-sense ratio of at least about 1,000:1. The power path stimulus is larger than the sense path stimulus by a factor of the intended current-sense ratio. The circuit further includes a sense amplifier to regulate current through the sense path and a comparator to compare a sense path circuit parameter measured during the stimulus application with the circuit parameter measured not during the stimulus application. The stimulus sources can be, for example, switched current sources.

In some of the examples the calibration stimulus application is applied at a low duty cycle and/or is driven by a white noise bitstream generator, such as a linear feedback shift register (LFSR) or a delta-sigma modulator, so that the stimulus application does not produce a tone that is correlated to any other signal in the system of which the power path is a part.

DETAILED DESCRIPTION

Figure 1:
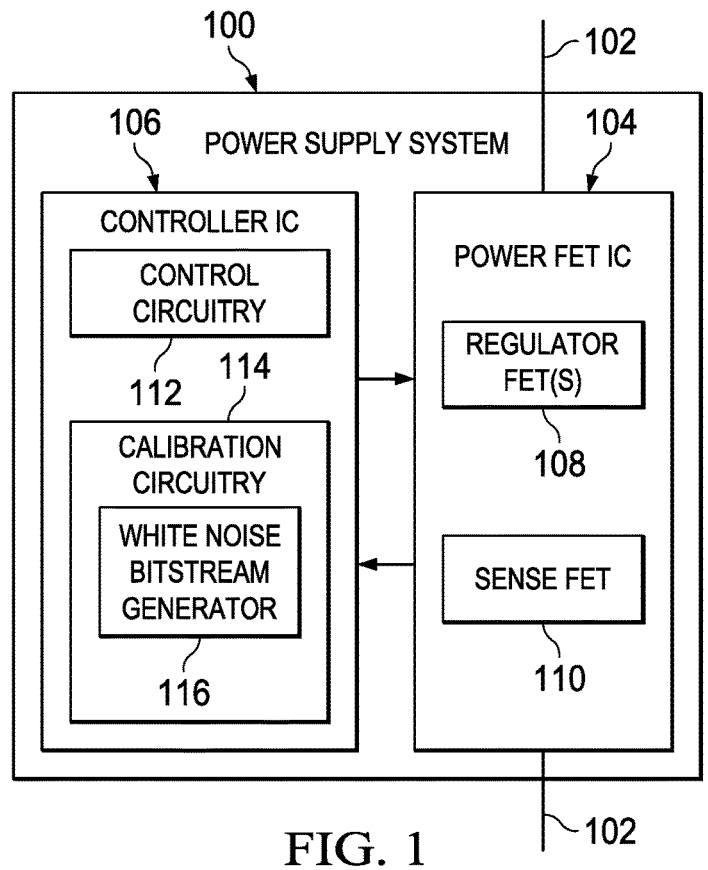
FIG. 1 is a system diagram of an example power supply system capable of regulating power between two devices along power path.

In some power control systems that include, on the one hand, power amplifier elements, e.g., field-effect transistors (FETs), and particularly metal-oxide-semiconductor FETs (MOSFETs), that are arranged to regulate the flow of power along a power path, and, on the other hand, control circuitry arranged to control the regulation provided by the power amplifier elements, it may be desirable to fabricate the power amplifier elements and the control circuitry separately. This is particularly true when economical and efficient power amplifier elements (e.g., NexFETs) are fabricated using a different process from electronic components in the control circuitry. Such separate fabrication can result in two separate integrated circuits (ICs), one IC for the power amplifier elements and one IC for the control circuitry. In some instances, two or more separate ICs can be co-packaged in a single multi-chip module (MCM) for the convenience of the purchaser in integrating the ICs into a larger electronic system, such as a circuit board for use in a laptop computer, for example. In other instances, however, the separate ICs are not co-packaged and are assembled only after a final test performed by a manufacturer of the ICs.

The power amplifier elements may have a current-sense ratio representative of the relative device size difference between a larger device and a small device used for sensing current through the larger device. The current-sense ratio may be, for example, 1,000:1, meaning that a sense current, i.e., the current through the smaller device, is one thousandth of the current flowing through the larger device and thus through the power path. The perceived current-sense ratio should be the intended number for proper regulation, e.g., limiting, of current through the power path. However, deviations in the current-sense ratio may arise from such error sources as circuit mismatch, process variation in power IC 202 or the control IC, or variations in metal resistance. As examples, things that will affect the current-sense ratio include die thickness, the particular implants received by the wafer from which power IC 202 is fabricated (making the wafer more or less conductive), and variations in thickness or delamination of back-side metal on power IC 202.

When a power IC and its associated control IC are co-packaged in an MCM, error sources in current-sense ratio can be calibrated for at final test. However, in other instances, it is not possible or not desirable to integrate power amplifier elements and control circuitry into a single MCM. In such instances, providing calibration measures to address current-sense ratio error sources in the power amplifier elements can pose a difficult problem, particularly in view of the undesirability of adding an expensive, power-consuming sense resistor to the system for calibration purposes.

The present disclosure describes a system that includes a stand-alone power MOSFET IC (e.g., a NexFET IC) that has at least one current-sense transistor, and one or more control ICs to control the stand-alone power IC, such that it is possible to sense current in an external FET (i.e., a FET external to the control IC) without adding a sense resistor in series with the system's power path. The present disclosure thus provides a solution for the situation when a power FET and its controller are packaged and tested separately, foreclosing the ability to calibrate the current-sense ratio at a final test performed by the IC manufacturer.

FIG. 1 is a system diagram of a power supply system 100 capable of regulating power between two devices (not shown) along power path 102, e.g., a USB power path. One such device may be, for example, a portable computer with a battery, while the second device may be, for example, a mobile telephone that charges its own battery by drawing power from the portable computer over power path 106. As another example, the second device can be an external battery to supply additional or backup power to the first device, e.g., the portable computer. Thus, power path 102 can be bidirectional or unidirectional. Power supply system 100 can be implemented in either or both of the two devices or as a standalone system. In some examples, power supply system 100 is implemented in desktop computer system or a portable computer system, such as a laptop computer or a notebook computer.

Power supply system 100 includes a power FET integrated circuit (IC) 104 to regulate the flow of power through power path 102 and a controller IC 106 to control and/or calibrate the power FET IC 104. In some examples, the ICs 104, 106 are fabricated using different processes. For example, the power FET IC 104 may be fabricated using a NexFET process while the controller IC 106 is not. In some examples, the ICs 104, 106 are not assembled by their manufacturer into system 100 and therefore are not both available as a pair for calibration at final test. For example, the ICs 106, 104 are not co-packaged in a single multi-chip module (MCM).

Power FET IC 104 can include one or more regulator FETs 108 to regulate the flow of electrical current through power path 102 and one or more sense FETs 110 to sense the current flowing through power path 102. Regulation of current can include switching of current and/or limiting of current. A sensed current signal or a signal derived from a sensed current may be provided to controller IC 106 for control and/or calibration purposes. The sensed current signal may be a current that is some small fraction of the current through power path 102. For example, the sensed current signal delivered from power FET IC 104 to controller IC 106 may be on the order of one thousandth the magnitude of the power path current.

In some examples, a regulator FET 108 and a sense FET 110 consist of a matched pair of FET devices arranged to have a common drain node, with a difference in relative size of the FET devices determining how current is split between the respective source nodes of the FET devices, the relative size difference resulting in a current-sense ratio. For example, the relative size difference between a regulator FET 108 and the corresponding sense FET 110 may result in a current-sense ratio on the order of 1,000:1. Owing to error sources including those described previously the intended current-sense ratio may differ from the current-sense ratio perceived by controller IC, i.e., by the ratio in magnitude between the power path current and the sensed current signal delivered from power FET IC 104 to controller IC 106. FETs 108, 110 can be, for example, NexFETs. In some examples, there is no sense resistance in power path 102.

Controller IC 106 can include control circuitry 112 to control how regulator FET(s) 108 regulate the flow of current through power path 102 and calibration circuitry 114 to calibrate a current-sense ratio that exists between regulator FET(s) 108 and sense FET 110. Calibration circuitry 114 can tune the perceived current-sense ratio by determining a current-sense ratio correction factor and then by modifying properties of FETs 108, 110, by trimming a resistor that is outside the power path 102, and/or by applying a digital correction that will change how control circuitry 112 operates to regulate power through power path 102 via regulator FET(s) 108.

Calibration circuitry 114 can make the correction factor determination by, for example, applying one or a series of test stimuli pulses to both the power path 102 and to the sense path (i.e., to the FETs 108, 110) that are proportioned in the intended current-sense ratio and then comparing a resultant sense path output voltage at stimulated and non-stimulated times. Test stimuli pulses can be applied by, for example, switched current source circuits, voltages applied through resistances, or switched-capacitor stimulus arrangements capable of delivering a fixed charge. In any case, the ratio of magnitudes between test stimulus pulses delivered to the power path as compared to the pulses to the sense path should be tightly proportioned and matched to the intended current-sense ratio because it represents the reference ratio in the system 100. So as to decorrelate test pulses from any tones that may exist in system 100, calibration circuitry may include a white noise bitstream generator 116 to produce an aperiodic stimulus signal that approximates white noise.

Figure 2:
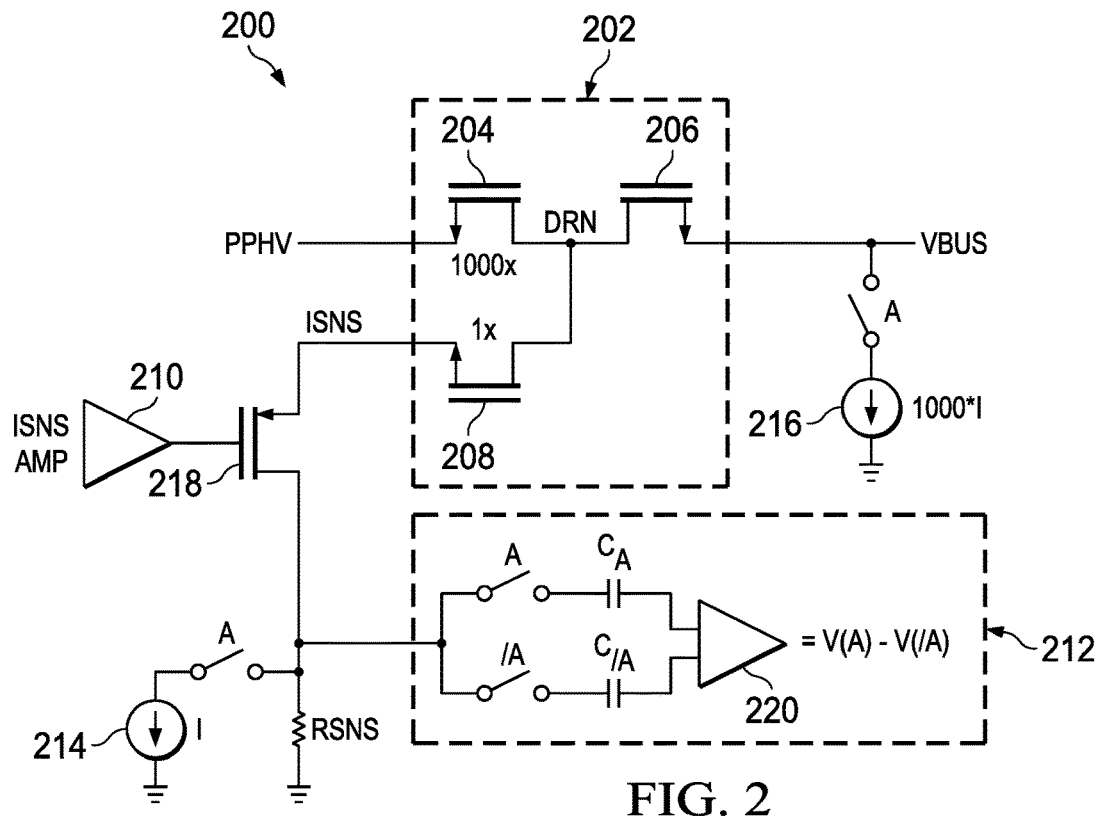
FIG. 2 is a circuit diagram of an example current-sense ratio calibration system.

FIG. 2 shows a circuit diagram of an example current-sense ratio calibration system 200. System 200 includes power IC 202, which can include regulator FETs 204, 206 and sense FET 208, and a control IC, which can include all other components illustrated, including sense amplifier 210 (labeled "ISNS AMP"), comparator 212, sense path current source 214, power path current source 216, sense path FET 218, resistance RSNS, and various switches as shown. A unidirectional or bidirectional power path, which can correspond to power path 102 in FIG. 1, runs between PPHV and VBUS. The PPHV-VBUS power path can be a very low impedance power path. In some examples, there may be no more than 100 milliohms of resistance in the power path. In some examples, there may be no more than 50 milliohms of resistance in the power path. For example, there may be only about 30 milliohms of resistance across transistors 204, 206. In some examples the power path is capable of supplying at least 3 amps of current. In some examples the power path is capable of supplying at least 5 amps of current.

FETs 204, 206, 208 can be, for example, NexFETs and thus can be fabricated using a different process than all other components shown. Power IC 202 and control IC can correspond to power FET IC and controller IC 106 in FIG. 1, respectively. In some examples, these two ICs may be separate components that are not combined in an MCM.

The control IC in system 200 regulates the flow of current between PPHV and VBUS by adjusting gate voltages at regulator FETs 204, 206. The control IC can thereby switch current, limit current, and/or control the direction of current flow. In some examples, the system 200 has a current-sense ratio error specification of ±10%, meaning that for an intended 3-amp current limit, for example, the actual power path current flow should be no less than 2.7 amps and no greater than 3.3 amps. If the perceived current-sense ratio is substantially greater or less than intended, the value at which the power path current is limited by the control IC may fall outside of the error specification. For example, if the intended current-sense ratio is 1,000:1 but the perceived current-sense ratio is 2,000:1, then an intended 3-amp current limit, as regulated, may, in actuality, be 6 amps, far outside a ±10% error specification. Without calibration, the current-sense ratio error can be expected to be, for example, as large as ±20-30%.

System 200 functions to calibrate the perceived current-sense ratio by the controller IC applying a test current via current source 216 and measuring how much the sense voltage across resistance RSNS changes. Comparator 212 can include error amplifier 220 that can measure the voltages across resistance RSNS during test and non-test states and subtract them to create an error term. This error term can be processed by a control loop that can dynamically correct the perceived current-sense ratio. Because resistance RSNS is not in the power path, it does not contribute to power path impedance.

When test current flow is on, the control IC measures current on node ISNS, which flows through sense FET 208 on the power IC 202 (e.g., on a NexFET die). Sense FET 208 can be a smaller replica transistor of the regulator FET 204, 206 of interest. Sense amplifier 210 regulates current through ISNS such that the smaller sense FET 208 and the applicable regulator FET 204, 206 have the same voltages across them, and hence the same current through them. In some examples, this means the voltage at node PPHV equals the voltage at node ISNS. In other examples, the opposite voltage is regulated, such that the voltage at node PPHV equals the negative of the voltage at node ISNS.

As mentioned above, when power IC 202 and its control IC are separate components and are assembled after each has been separately tested, the aforementioned sources of current-sense ratio error cannot be calibrated for at final test following the manufacture of the components. Also as mentioned previously, the control IC can use an external sense resistor in the power path to sense current. However, sense resistors are expensive, due to their accuracy and power dissipation requirements, and also eat into the total resistance budget in the power path (i.e., in the PPHV-VBUS path), which may be a very low impedance path. The addition of a sense resistor is thus undesirable in the power path. Therefore, the following functioning avoids the need for a sense resistor in the power path.

System 200 can operate in either of two states, A and /A ("not A"), as determined by the positions of the A and /A switches illustrated in FIG. 2. In the /A state, the A switches are open, the /A switch is closed, and current sources 214 and 216 are turned off. In the A state, during which all A switches are closed (and the /A switch is open), system 200 turns on sense path current source 214 and power path current source 216 simultaneously, current source 216 being configured to produce a test current that is larger than the current produced by current source 214 by a factor of the intended current-sense ratio. For purposes of illustration, the labels in FIG. 2 indicate, by example, that the intended current-sense ratio is 1,000:1, but the intended current-sense ratio could be any superunity ratio. The test current produced by power path current source 216 may be a substantial fraction (e.g., between 1-10%, e.g., 3%) of the power current flowing through the power path. Thus, for example, if the power path current is 3 amps, the test current may be between 50 and 100 milliamps. The current produced by sense path current source 214 would correspondingly be between 50 and 100 microamps, i.e., less than the test current by a factor of the intended current-sense ratio, e.g., 1,000 times less in the illustrated example.

If the perceived current-sense ratio is exactly identical to the intended current-sense ratio—i.e., in the illustrated example, if the perceived current-sense ratio between regulator FET 204 or 206 and sense FET 208 is exactly 1,000:1—then turning on the two current sources 214, 216 will have no effect on the circuit of system 200 and the voltage across RSNS is undisturbed because the two applied currents will cancel each other out, current source 216 producing a current that is 1,000 times that of current source 214. The aforementioned error sources can cause the perceived current-sense ratio to differ from the intended current-source ratio, causing the applied currents to induce a voltage change across the resistor RSNS in the A state as compared to the /A state.

This state-varying voltage change can be measured by comparator 212, e.g., a switched-capacitor comparator having a very low offset. Comparator 212 is illustrated as an illustrative functional representation rather than as a functioning circuit, and could be implemented in a number of ways. In the A state, with the test stimulus being applied by virtue of both current sources 214, 216 being turned on, comparator 212 can sample the voltage in capacitor $C_A$. In the /A state, with both current sources 214, 216 turned off, comparator 212 can sample the voltage on capacitor $C_{/A}$. Comparator 212 thereby determines the voltage change across resistor RSNS for the two states, i.e., V(A)−V(/A). For example, in recognition that the sense current through ISNS is very small, error amplifier 220 can generate a single-bit output. Depending on whether the voltage change V(A)−V(/A) is positive or negative, system 200 can tune the perceived current-sense ratio accordingly. Although comparator 212 is illustrated as a switched-capacitor comparator, any appropriate comparator can be used.

The perceived current-sense ratio can be tuned in a variety of ways. In some examples, the FET ratio can be tuned directly by modifying properties of the FETs. In other examples, the perceived current-sense ratio can be tuned by trimming resistor RSNS. In still other examples, the ratio can be tuned by applying a digital correction. For example, the voltage across resistor RSNS can be directed to an analog-to-digital converter (ADC), and suitable digital logic can adjust the power path current regulation applied at FET(s) 204, 206 with knowledge of the V(A)−V(/A) difference, i.e., of the high or low percentage difference between the FET ratio perceived and the intended current-sense ratio. In some examples, the magnitude of the stimulus, e.g., the value of current source 216, can be adjusted along with the RSNS trim or whatever other method of current-sense ratio tuning is applied.

Figure 3:
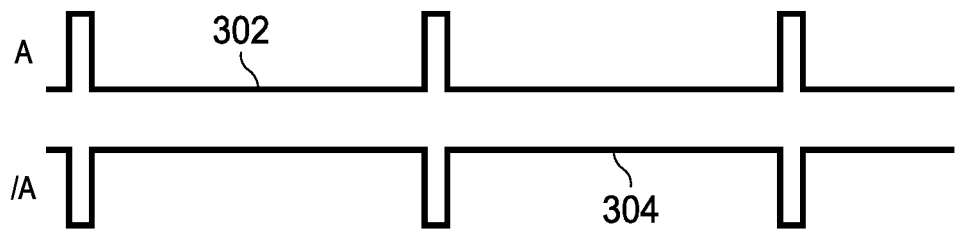
FIG. 3 shows a low duty cycle waveform and its inverse.

Because, as mentioned above, the test current produced by power path current source 216 may be a substantial fraction (e.g., 3%) of the power current flowing through the power path, application of the test current continuously during operation of system 200 may unduly incur power dissipation. The test current therefore may be applied as pulses with a low duty cycle, as illustrated in FIG. 3. FIG.

3 is not drawn to scale, but nevertheless conveys that the A state 302 may be applied periodically and as a small fraction of the time of the /A state 304. As an example, in order to minimize power dissipation, the A vs. /A duty cycle may be 1 microsecond of A-state operation for every 1 millisecond of /A-state operation. A duty cycle of 0.1% means that the average power consumption of the test current is 1,000 times less than under 100% duty cycle conditions. Each A-state switching of the test current may constitute one measurement sample, and the results of numerous measurement samples may be averaged, extrapolated, or otherwise statistically manipulated to arrive at the appropriate current-sense ratio correction factor. The A and /A switches illustrated in FIG. 2 can be implemented, for example, as single-transistor switches (e.g., a MOSFETs) so that their actuation can be programmatically controlled by appropriate logic.

When the test current is applied purely periodically, as illustrated in FIG. 3, a tone may result in the power supply. For the example of a 1 microsecond to 1 millisecond duty cycle, a 1 kilohertz tone in the power supply will result. This tone may be disruptive to a connected device when the power supply provides power for a chip that has power-sensitive circuitry (e.g., a USB data chip). The tone may also result in an inaccurate current-sense ratio correction determination when a connected device produces a same-frequency tone on the power path, or any tone that interferes with the measurement. Therefore, instead of driving the A-state with a regular duty cycle, the A-state can be driven in a pattern that approximates a white noise signal, which is guaranteed to be decorrelated from any other signal in the system.

Any simulated white-noise bitstream generator may be used to control the A and /A switches and thereby to generate the test stimulus pulses. A bitstream with a pseudorandom duty cycle can be generated, for example, using a linear feedback shift register (LFSR), which is a digital circuit made of, for example, on the order of ten flip-flops to produce a non-repeating pattern of 1024 bits that approximates white noise. LFSRs having more flip-flops can produce even longer patterns. As another example, a delta-sigma modulator can be used to produce a noise spectrum that approximates white noise. The delta-sigma modulator would not need to be of the complex variety used for a high-resolution analog-to-digital converter, but rather might only be of a type that could be implemented using a small number of flip-flops.

Thus, the controller IC can calibrate the current-sense ratio of external power IC 202 by applying a known test current and measuring the perceived current-sense ratio. The perceived current-sense ratio can be tuned by adjusting resistance RSNS (in FIG. 2) or any other downstream gain in the controller. This calibration can be done during an initial power-up period or periodically or continuously during operation of system 100 (FIG. 1) or 200 (in FIG. 2).

In some instances, it may require, e.g., on the order of 1,000 calibration readings (i.e., pulses of the A state) to completely calibrate the current-sense ratio. If the calibration readings have a very low duty cycle, e.g., 1:1,000, it may mean that the calibration process can take a long time, e.g., on the order of seconds, to converge on target accuracy. For example, if 1,000 calibration readings are required to calibrate the current-sense ratio, and readings are done, on average, at a rate of once every millisecond, it may take a full second for the calibration process to complete.

Systems 100 or 200 can be integrated in the USB power system of a larger system, e.g., a desktop computer system, or a portable electronic device, such as a portable computer.

The calibration process can be performed at either or both of the startup of the larger system, or "in situ," i.e., regularly during the operation of the system. Performing the calibration at the startup of a larger system in which system 100 or system 200 is integrated can have the benefit of a guarantee that the calibration is performed in the absence of any other signal. This can be guaranteed by configuring the system to perform the calibration as one of a series of startup steps and not proceeding with other steps in the sequence in parallel with the calibration, i.e., by waiting for the calibration to complete once it has been initiated before proceeding with the remainder of the startup sequence. If the calibration is configured to be performed only on startup, then there may be no need to decorrelate the calibration stimuli and therefore no need for decorrelation circuitry such as the aforementioned LFSR or delta-sigma modulator.

However, when the larger system into which system 100 or system 200 is integrated is, for example, a desktop computer, a laptop computer, or a notebook computer, performing the calibration process at system startup may slow the computer's startup process, which may be irritating to the computer's user, even when the calibration-related halt is only on the order of a few seconds. Moreover, since the temperature of the larger system and system 100 or system 200 may increase or decrease throughout operation, temperature-related current-sense ratio error may drift over time. Thus, a startup-only calibration will not trim out any temperature-related drift. Therefore, in some instances, an "in situ" calibration can be used to continuously or periodically calibrate the current-sense ratio throughout the course of operation. If the calibration signal is decorrelated, as described above, then system tones should not affect accuracy the calibration accuracy, and the in situ calibration will work to trim out temperature drift. Moreover, larger system startup times can be improved by omitting a startup calibration routine. Although the current-sense ratio may be have reduced accuracy initially on startup when startup calibration is not used, it can quickly converge on, for example, a ±10% accuracy within a few seconds of startup.

Figure 4:
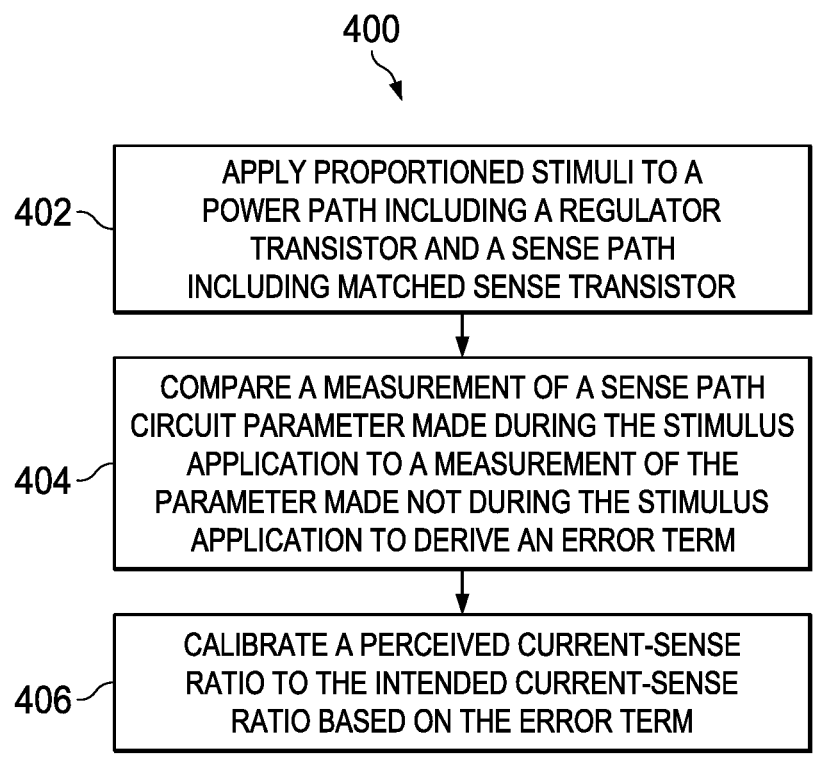
FIG. 4 is a flow chart illustrating a method of current-sense ratio calibration in a circuit having a power path.

FIG. 4 is a flow chart illustrating a method 400 of current-sense ratio calibration in a circuit having a power path. The method can include applying 402 proportioned stimuli to the power path including a regulator transistor and a sense path including a matched sense transistor, the regulator transistor and sense transistor having an intended current-sense ratio associated therewith, e.g., 1,000:1. The stimuli should be tightly proportioned and the proportion should be matched to the intended current-sense ratio. Thus, for example, the stimulus applied to the power path can have a magnitude that is larger than the magnitude of the stimulus applied to the sense path by a factor of the intended current-sense ratio, or stated in other words, the proportion of the power path stimulus to the sense path stimulus is the intended current-sense ratio.

The method can continue by comparing 404 a measurement of a sense path circuit parameter made during the stimulus application to a measurement of the parameter made not during the stimulus application to derive an error term. The circuit parameter can be, for example, a voltage across a resistance in the sense path or a current through a sense path node.

The method can further include calibrating 406 a perceived current-sense ratio to the intended current-sense ratio based on the error term. The calibration can take the form of changing a circuit property or applying a digital correction. As an example of changing a circuit property, a resistance in the sense path can be trimmed. As an example of applying a digital correction, digital logic can be programmed to limit current through the power path with knowledge of the difference between the intended current-sense ratio and the perceived current-sense ratio.

The stimulus application 402, measurement comparison 404, and calibration 406 can repeat a number of times, for example, indefinitely, or until an error specification is met. The error specification may be, for example, that a limit of current through the power path is within a predetermined tolerance of a value, e.g., within ±10% of 3 amps. The stimulus application may be periodic with a low duty cycle, e.g. no greater than 1:1000, or aperiodic and decorrelated from any other signal. For example, the stimulus may be driven so as to approximate white noise. Even after the error specification is met, the stimulus application 402, measurement comparison 404, and calibration 406 can be periodically repeated to address thermally-induced current-sense ratio changes. The stimulus application 402, measurement comparison 404, and calibration 406 can be performed only outside of a system startup phase, i.e., a boot-up phase, so as to eliminate calibration-induced startup delay. As used herein, "system startup phase" and "boot-up phase" mean that power-on initialization phase of a computer system prior to the completion of which operational user inputs are not accepted for processing, excepting those inputs that would interrupt the initialization phase to configure the initialization.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Unless specified otherwise and where context permits, "about" means within a tolerance of plus or minus five percent. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
   a first integrated circuit (IC) including a power path and a sense path, the power path including a regulator FET configured to regulate a current through the power path, and the sense path including a sense FET configured to provide a sense current through the sense path, in which a current-sense ratio is a ratio between a size of the regulator FET and a size of the sense FET; and
   a second IC including calibration circuitry configured to calibrate the current-sense ratio by steps including:
      applying stimuli to the power and sense paths in proportion to the current-sense ratio;
      while applying the stimuli, obtaining a first measurement of a current in the sense path or of a voltage in the sense path;
      while not applying the stimuli, obtaining a second measurement of the current in the sense path or of the voltage in the sense path; and
      comparing the first and second measurements.

2. The system of claim 1, wherein the current-sense ratio is a first current-sense ratio, and the calibration circuitry is configured to calibrate a second current-sense ratio to the first current-sense ratio based on comparing the first and second measurements.

3. The system of claim 1, wherein the first IC is a NexFET IC.

4. The system of claim 1, wherein the power path is a USB power path.

5. The system of claim 1, wherein the power path is not in series with a sense resistor.

6. The system of claim 1, further comprising a white noise bitstream generator, in which applying the stimuli is responsive to an actuation by the white noise bitstream generator, and a spectrum of the stimuli is uncorrelated to signals in the first IC.

7. The system of claim 6, wherein the white noise bitstream generator includes a linear feedback shift register (LFSR).

8. The system of claim 6, wherein the white noise bitstream generator includes a delta-sigma modulator.

9. A method comprising:
   applying proportioned stimuli to
      a power path including a regulator transistor; and
      a sense path including a sense transistor, in which a current-sense ratio is a ratio between a size of the regulator transistor and a size of the sense transistor;
   while applying the stimuli, obtaining a first measurement of a current in the sense path or of a voltage in the sense path;
   while not applying the stimuli, obtaining a second measurement of the current or of the voltage;
   determining an error term based on a comparison between the first and second measurements; and
   calibrating a second current-sense ratio to the first current-sense ratio based on the error term.

10. The method of claim 9, wherein the stimuli include a first stimulus to the power path and a second stimulus to the sense path, and a ratio between the first stimulus and the second stimulus is equal to the first current-sense ratio.

11. The method of claim 9, wherein applying the stimuli is responsive to an actuation by a white noise bitstream generator, an integrated circuit includes the power path, and applying the stimuli does not produce a tone that is correlated to signals in the integrated circuit.

12. The method of claim 9, wherein the voltage is across a resistance in the sense path, or the current is through a portion of the sense path.

13. The method of claim 9, wherein calibrating the second current-sense ratio to the first current-sense ratio includes trimming a resistance in the sense path to adjust the second current-sense ratio.

14. The method of claim 9, further comprising programming digital logic to limit a current in the power path based on a difference between the first and second current-sense ratios.

15. A circuit comprising:
   a power path including a power field effect transistor (FET) configured to regulate a current through the power path;
   a sense path including a sense FET that is smaller than the power FET, in which a current-sense ratio is a ratio between a size of the power FET and a size of the sense FET;
   a power path stimulus source configured to apply a first stimulus to the power path;
   a sense path stimulus source configured to apply a second stimulus to the sense path, in which a ratio between the first stimulus and the second stimulus is equal to the current-sense ratio, and the first stimulus and the second stimulus are simultaneous; and a comparator configured to compare the first and second measurements.

16. The circuit of claim 15, wherein an impedance of the power path is no more than 100 milliohms.

17. The circuit of claim 15, wherein the comparator is a switched-capacitor comparator.

18. The circuit of claim 15, wherein the power path is not in series with a sense resistor.

19. The circuit of claim 15, wherein the current-sense ratio is at least 1,000:1.

20. The circuit of claim 15, further comprising a sense amplifier configured to regulate a sense current through the sense path.

* * * * *